United States Patent

Annapragada et al.

[11] Patent Number: 6,057,245
[45] Date of Patent: May 2, 2000

[54] GAS PHASE PLANARIZATION PROCESS FOR SEMICONDUCTOR WAFERS

[75] Inventors: Rao V. Annapragada, San Jose; Calvin T. Gabriel, Cupertino; Milind G. Weling, San Jose, all of Calif.

[73] Assignee: VLSI Technology, Inc., San Jose, Calif.

[21] Appl. No.: 09/233,640

[22] Filed: Jan. 19, 1999

[51] Int. Cl.$^7$ .................................................. H01L 21/302
[52] U.S. Cl. .................... 438/706; 438/690; 438/710; 438/711; 438/712
[58] Field of Search .................... 438/689, 690, 438/691, 692, 693, 710, 712, 719, 745, 909; 156/345; 451/28, 34, 66, 65; 134/1.2, 31

[56] References Cited

U.S. PATENT DOCUMENTS

| | | | |
|---|---|---|---|
| 4,944,836 | 7/1990 | Beyer et al. | 156/645 |
| 5,288,333 | 2/1994 | Tanaka et al. | 134/31 |
| 5,441,094 | 8/1995 | Pasch | 156/636.1 |
| 5,942,445 | 8/1999 | Kato et al. | 438/691 |

*Primary Examiner*—Benjamin L. Utech
*Assistant Examiner*—Lan Vinh
*Attorney, Agent, or Firm*—Wagner, Murabito & Hao LLP

[57] ABSTRACT

A gas phase planarization process for semiconductor wafers. The present invention comprises a system and method of dry planarization for a semiconductor wafer. For instance, the present invention includes a system adapted to effectively remove all, or a portion of, a layer of dielectric material of a semiconductor wafer through the application of dry abrasion and dry chemistry. As such, a present invention system flattens out height differences of the dielectric material, since high areas of topography are removed faster than low areas. Specifically, one embodiment of the present invention utilizes a dry abrasive polishing pad to abrade the desired surface of the semiconductor wafer within a vacuum planarization chamber. As a result of abrading the surface, the abrasive polishing pad breaks the chemical bonds of a thin layer of the dielectric surface material. Once the chemical bonds are broken, reactive radicals within a plasma gas chemically react with the surface material thereby forming a gaseous species which is highly volatile. In other words, the plasma gas is used to remove previously mechanically polished material from the dielectric layer. Subsequently, the newly formed gaseous species is removed from the vacuum planarization chamber. This process of removing material from the surface of the semiconductor wafer continues until the surface is sufficiently planarized. In this manner, the present invention provides a dry process for planarizing a surface of a semiconductor wafer.

15 Claims, 10 Drawing Sheets

GAS PHASE PLANARIZATION PROCESS FOR SEMICONDUCTOR WAFERS

TECHNICAL FIELD

The field of the present invention pertains to semiconductor fabrication processing. More particularly, the present invention relates to a method and system for planarizing semiconductor wafers.

BACKGROUND ART

Most of the power and usefulness of today's digital integrated circuit (IC) devices can be attributed to the increasing levels of integration. More and more components (resistors, diodes, transistors, and the like) are continually being integrated into the underlying chip, or IC. The starting material for typical ICs is very high purity silicon. The material is grown as a single crystal. It takes the shape of a solid cylinder. This crystal is then sawed (like a loaf of bread) to produce wafers typically 10 to 30 cm in diameter and 250 microns thick.

The geometry of the features of the IC components are commonly defined photographically through a process known as photolithography. Very fine surface geometries can be reproduced accurately by this technique. The photolithography process is used to define component regions and build up components one layer on top of another. Complex ICs can often have many different built up layers, each layer having components, each layer having differing interconnections, and each layer stacked on top of the previous layer. The resulting topography of these complex IC's often resemble familiar terrestrial "mountain ranges," with many "hills" and "valleys" as the IC components are built up on the underlying surface of the silicon wafer.

In the photolithography process, a mask image, or pattern, defining the various components, is focused onto a photo-sensitive layer using ultraviolet light. The image is focused onto the surface using the optical means of the photolithography tool, and is imprinted into the photosensitive layer. To build ever smaller features, increasingly fine images must be focused onto the surface of the photosensitive layer, i.e., optical resolution must increase. As optical resolution increases, the depth of focus of the mask image correspondingly narrows. This is due to the narrow range in depth of focus imposed by the high numerical aperture lenses in the photolithography tool. This narrowing depth of focus is often the limiting factor in the degree of resolution obtainable, and thus, the smallest components obtainable using the photolithography tool. The extreme topography of complex ICs, the "hills" and "valleys," exaggerate the effects of decreasing depth of focus. Thus, in order to properly focus the mask image defining sub-micron geometries onto the photosensitive layer, a precisely flat surface is desired. The precisely flat (i.e., fully planarized) surface will allow for extremely small depths of focus, and in turn, allow the definition and subsequent fabrication of extremely small components.

Chemical mechanical polishing (CMP) is a preferred method of obtaining full planarization of a semiconductor wafer. It involves removing a sacrificial layer or portion of sacrificial layer of dielectric material using mechanical contact between the wafer and a moving polishing pad saturated with slurry. Polishing flattens out height differences, since high areas of topography (hills) are removed faster than areas of low topography (valleys). Polishing is the only technique with the capability of smoothing out topography over millimeter scale planarization distances leading to maximum angles of much less than one degree after polishing.

FIG. 1 shows a top view of a chemical mechanical polishing (CMP) machine 100 and FIG. 2 shows a side view of CMP machine 100. CMP machine 100 is fed semiconductor wafers to be polished. CMP machine 100 picks up the wafers with an arm 101 and places them onto a rotating polishing pad 102. Polishing pad 102 is made of a resilient material and is textured, often with a plurality of predetermined grooves 103, to aid the polishing process. Polishing pad 102 rotates on a platen 104 (not shown in FIG. 1), or turn table located beneath polishing pad 102, at a predetermined speed. A wafer 105 is held in place on polishing pad 102 within a carrier ring 112 that is connected to a carrier film 106 (not shown in FIG. 1) of arm 101. The lower surface of wafer 105 rests against polishing pad 102. The upper surface of wafer 105 is against the lower surface of carrier film 106 of arm 101. As polishing pad 102 rotates, arm 101 rotates the wafer 105 at a predetermined rate. Arm 101 forces wafer 105 into the polishing pad 102 with a predetermined amount of down force. CMP machine 100 also includes a slurry dispense arm 107 extending across the radius of polishing pad 102 which dispenses a flow of slurry onto polishing pad 102.

The slurry is a mixture of deionized water and polishing agents designed to chemically aid the smooth and predictable planarization of the wafer. The rotating action of both polishing pad 102 and wafer 105, in conjunction with the polishing action of the slurry, combine to planarize, or polish, wafer 105 at some nominal rate. This rate is referred to as the removal rate. A constant and predictable removal rate is important to the uniformity and throughput performance of the wafer fabrication process. The removal rate should be expedient, yet yield precisely planarized wafers, free from surface anomalies. If the removal rate is too slow, the number of planarized wafers produced in a given period of time decreases, hurting wafer throughput of the fabrication process. If the removal rate is too fast, the CMP planarization process will not be uniform across the surface of the wafers, hurting the yield of the fabrication process.

To aid in maintaining a stable removal rate, CMP machine 100 includes a conditioner assembly 120. Conditioner assembly 120 includes a conditioner arm 108, which extends across the radius of polishing pad 102. An end effector 109 is connected to conditioner arm 108. End effector 109 includes an abrasive conditioning disk 110 which is used to roughen the surface of polishing pad 102. Conditioning disk 110 is rotated by conditioner arm 108 and is translationally moved towards the center of polishing pad 102 and away from its center, such that conditioning disk 110 covers the radius of polishing pad 102. In so doing, conditioning disk 110 covers the surface area of polishing pad 102, as polishing pad 102 rotates. A polishing pad having a roughened surface has an increased number of micro-pits and gouges in its surface from conditioner assembly 120 and therefore produces a faster removal rate. This is due in part to the increase in slurry transfer to the surface of wafer 105 and the increase polishing by-product removal away from the surface of wafer 105. Without conditioning, the surface of polishing pad 102 is smoothed during the polishing process and removal rate decreases dramatically. Conditioner assembly 120 re-roughens the surface of polishing pad 102, thereby improving the removal rate by improving the transport of slurry and by-products.

As described above, the CMP process uses an abrasive slurry on a polishing pad. The polishing action of the slurry is comprised of an abrasive frictional component and a chemical component. The abrasive frictional component is due to the friction between the surface of the polishing pad, the surface of the wafer, and abrasive particles suspended in the slurry. The chemical component is due to the presence in the slurry of polishing agents which chemically interact with the material of the dielectric layer of wafer 105. The chemical component of the slurry is used to soften the surface of the dielectric layer to be polished, while the frictional component removes material from the surface of wafer 105.

Referring still to FIG. 1 and FIG. 2, the polishing action of the slurry determines the removal rate and removal rate uniformity, and thus, the effectiveness of the CMP process. As slurry is "consumed" in the polishing process, the transport of fresh slurry to the surface of wafer 105 and the removal of polishing by-products away from the surface of wafer 105 becomes very important in maintaining the removal rate. Slurry transport is facilitated by the texture of the surface of polishing pad 102. This texture is comprised of both predefined grooves 103 and micro-pits that are manufactured into the surface of polishing pad 102 and the inherently rough surface of the material from which polishing pad 102 is made.

The slurry is typically transported by grooves 103 or pits of polishing pad 102 under the edges of wafer 105 as both polishing pad 102 and wafer 105 rotate. Consumed slurry and polishing by-products, in a similar manner, are also typically transported by grooves 103 or pits of polishing pad 102 away from the surface of wafer 105. As the polishing process continues, fresh slurry is continually dispensed onto the polishing pad from slurry dispense arm 107. The polishing process continues until wafer 105 is sufficiently planarized and removed from polishing pad 102.

There are several disadvantages associated with the CMP planarization process of semiconductor wafers described above. One of the main disadvantages is that a typical CMP process produces large amounts of liquid waste by-products (e.g., slurry, deionized water, and other chemicals). As such, a semiconductor device manufacturer incurs additional expenses in order to properly dispose of the waste by-products, recycle the waste by-products, or both. It should be appreciated that any of these options for handling the waste by-products of the CMP process can be expensive and are therefore disadvantageous to semiconductor manufacturers.

Another one of the main disadvantages associated with a conventional CMP process is that a typical water base slurry utilized during the CMP process negatively impacts the dielectric constant of some types of spin on glass materials. Such spin on glass materials include hydrogen silsesquioxane (HSQ) and methyl silsesquioxane (MSQ). The spin on glass materials are used to fabricate semiconductor devices on semiconductor wafers. It should be appreciated that the slurry attacks some types of spin on glass materials on contact, thereby ruining the whole stack of the wafer. Therefore, typical CMP processes are ineffective for planarizing semiconductor wafers fabricated with some types of spin on glass materials.

Furthermore, there is another disadvantage associated with a typical CMP process. Specifically, the CMP process is not a very effective planarization process for organic polymers (e.g., carbon hydrogen components), which are used as low dielectric constant materials within semiconductor devices. One of the main reasons CMP is not very effective is that chemical components within typical slurries are unable to sufficiently soften organic polymers. As a result, it is difficult to remove the desired amount of an organic polymer.

Accordingly, what is desired is a system and method for planarizing semiconductor wafers which does not produce significant amounts of liquid waste by-products. Furthermore, what is desired is a system and method for effectively planarizing semiconductor wafers having spin on glass materials (e.g., HSQ and MSQ) deposited thereon. Moreover, what is desired is a system and method for effectively planarizing semiconductor wafers having organic polymers (e.g., carbon hydrogen) deposited thereon. The present invention provides these advantages. These and other advantages of the present invention not specifically mentioned above will become clear within discussions of the present invention presented herein.

DISCLOSURE OF THE INVENTION

The present invention comprises a system and method of dry planarization for a semiconductor wafer. For instance, the present invention includes a system adapted to effectively remove all, or a portion of, a layer of dielectric material of a semiconductor wafer through the application of dry abrasion and dry chemistry. As such, a present invention system flattens out height differences of the dielectric material, since high areas of topography are removed faster than low areas.

Specifically, one embodiment of the present invention utilizes a dry abrasive polishing pad to abrade the desired surface of the semiconductor wafer within a vacuum planarization chamber. As a result of abrading the surface, the abrasive polishing pad breaks the chemical bonds of a thin layer of the dielectric surface material. Once the chemical bonds are broken, reactive radicals within a plasma gas chemically react with the surface material thereby forming a gaseous species which is highly volatile. In other words, the plasma gas is used to remove previously mechanically polished material from the dielectric layer. Although these processes of mechanical and chemical removal of material are described separately, they would typically be occurring simultaneously. Subsequently, the newly formed gaseous species is removed from the vacuum planarization chamber. This process of removing material from the surface of the semiconductor wafer continues until the surface is sufficiently planarized. In this manner, the present embodiment provides a dry process for planarizing a surface of a semiconductor wafer. It should be appreciated that a process in accordance with the present invention has the capability of smoothing out topography over millimeter scale planarization distances, leading to maximum planarization angles of much less than one degree after the gas phase planarization process.

Specifically, one embodiment of the present invention includes a method for improving planarization of a semiconductor wafer. The method comprises the steps of placing a semiconductor wafer onto a polishing pad of a mechanical polishing machine. The semiconductor wafer includes a dielectric layer. Furthermore, the semiconductor wafer and the polishing pad are located within a vacuum chamber. Another step of the method involves forming a vacuum within the vacuum chamber. Subsequently, there is a step of weakening or breaking a plurality of chemical bonds of the dielectric layer of the semiconductor wafer through a mechanical action of frictionally moving the dielectric layer against a dry abrasive surface of the polishing pad. The step of breaking the plurality of chemical bonds results in material of the dielectric layer becoming amenable for chemical attack. Another step involves removing the material of the dielectric layer from the vacuum chamber utilizing a reactive gas. It should be appreciated that within the present embodiment the reactive gas can be ionized gas.

These and other advantages of the present invention will no doubt become obvious to those of ordinary skill in the art after having read the following detailed description of the preferred embodiments which are illustrated in the drawing figures.

BRIEF DESCRIPTION OF THE DRAWINGS

The accompanying drawings, which are incorporated in and form a part of this specification, illustrate embodiments of the invention and, together with the description, serve to explain the principles of the invention.

Prior Art

Prior Art

BEST MODE FOR CARRYING OUT THE INVENTION

Figure 1:
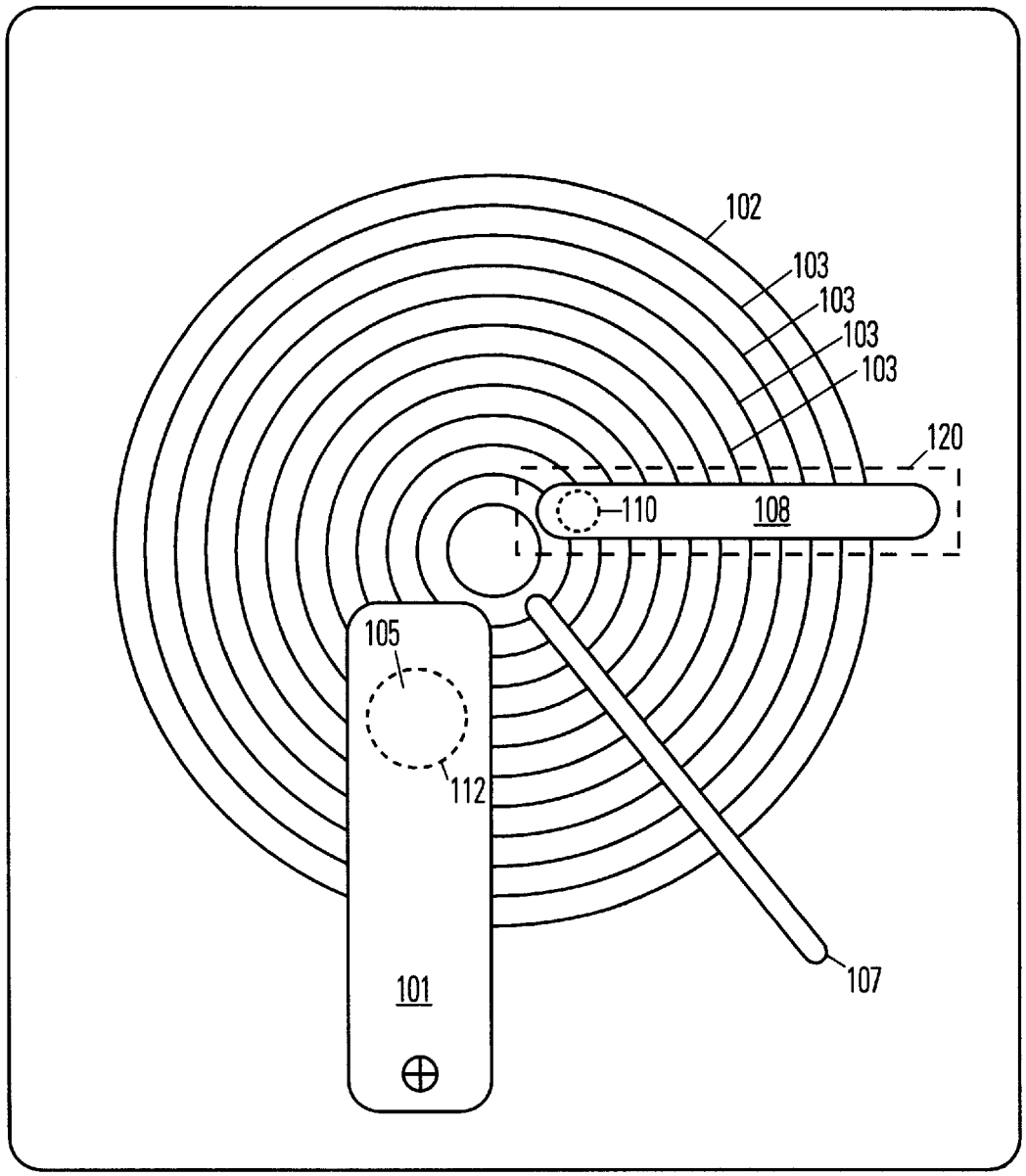
FIG. 1 is a top view of a prior art chemical mechanical polishing machine.
Figure 2:
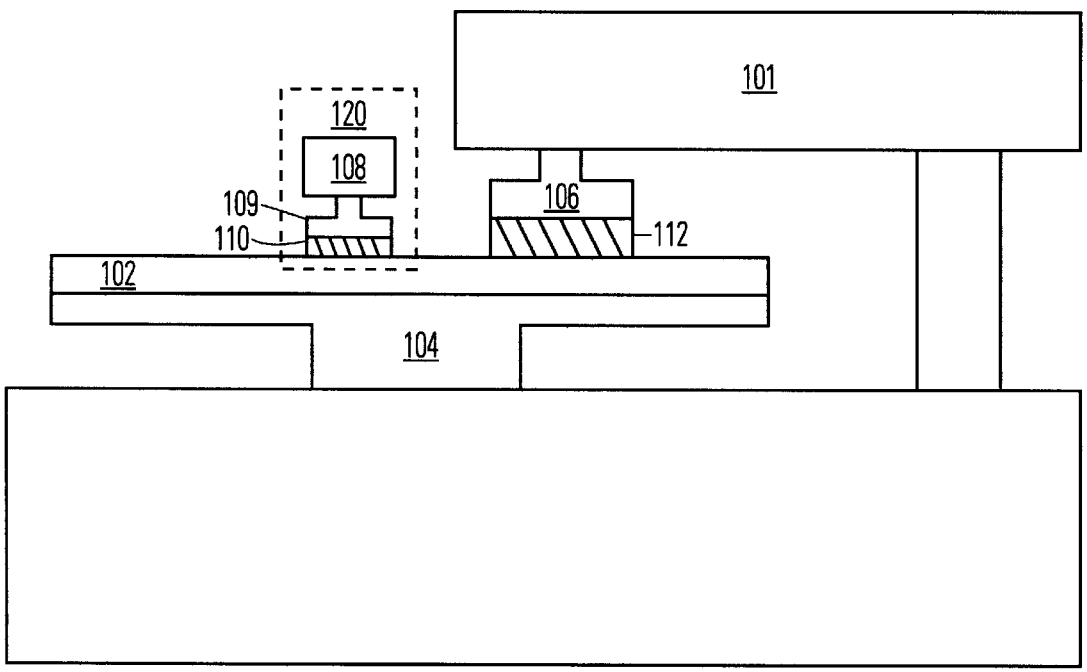
FIG. 2 is a side view of the prior art chemical mechanical polishing machine of FIG. 1.

In the following detailed description of the present invention, a system and method of dry planarization for semiconductor wafers, numerous specific details are set forth in order to provide a thorough understanding of the present invention. However, it will be obvious to one of ordinary skill in the art that the present invention may be practiced without these specific details. In other instances, well known methods, procedures, components, and circuits have not been described in detail as not to unnecessarily obscure aspects of the present invention.

The present invention comprises a system and method of dry planarization for a semiconductor wafer containing devices. For instance, the present invention includes a system adapted to effectively remove all, or a portion of, a layer of dielectric material of a semiconductor wafer through the application of dry abrasion and dry chemistry. As such, a present invention system flattens out height differences of the dielectric material, since high areas of topography (hills) are removed faster than low areas of topography (valleys).

Specifically, one embodiment of the present invention utilizes a dry abrasive polishing pad to abrade the desired surface of the semiconductor wafer within a vacuum planarization chamber. As a result of abrading the surface, the abrasive polishing pad breaks or weakens the chemical bonds of a thin layer of the dielectric surface material. Once the chemical bonds are weakened or broken, reactive radicals within a plasma gas chemically react with the surface material thereby forming a gaseous species which is highly volatile. In other words, the plasma gas is used to remove previously mechanically polished material from the dielectric layer. Subsequently, the newly formed gaseous species is removed from the vacuum planarization chamber. This process of removing material from the surface of the semiconductor wafer continues until the surface is sufficiently planarized. In this manner, the present embodiment provides a dry process for planarizing a surface of a semiconductor wafer. It should be appreciated that a process in accordance with the present invention has the capability of smoothing out topography over millimeter scale planarization distances, leading to maximum angles of much less than one degree after planarization.

The present invention improves planarization of semiconductor wafers in several different ways. For instance, unlike conventional wet CMP processes, the present invention does not produce significant amounts of liquid waste by-products. Furthermore, the present invention effectively planarizes semiconductor wafers having spin on glass materials (e.g., HSQ and MSQ) or organic polymers (e.g., carbon hydrogen) disposed thereon. Additionally, the present invention enables quick planarization of semiconductor wafers while also providing strong end point detection. Moreover, the present invention provides a dry process for planarizing semiconductors wafers wherein the process is more controllable and predictable than are typical wet CMP processes. More predictable planarization reduces the use of test wafers to determine the current performance of the abrading machine, resulting in additional cost savings for the manufacturer of semiconductor devices. The dry planarization system of the present invention and its benefits are described in greater detail below.

Figure 3:
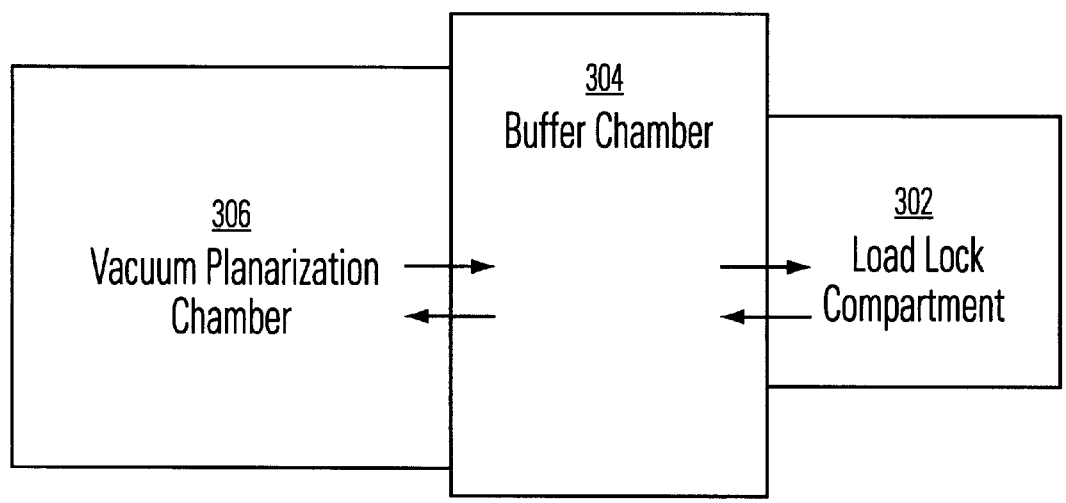
FIG. 3 is a block diagram overview of a system used for dry planarization of semiconductor wafers in accordance with one embodiment of the present invention.

FIG. 3 is a block diagram overview of a system 300 used for dry planarization of semiconductor wafers in accordance with one embodiment of the present invention. The three main compartments which are used within system 300 for dry planarization of semiconductor wafers include a load lock compartment 302, a buffer chamber 304, and a vacuum planarization chamber 306. In order for semiconductor wafers to be planarized within system 300, they are inserted into a cassette which is then loaded into load lock compartment 302. Once the cassette is loaded, a door (not shown) of load lock compartment 302 is closed and then the pressure within load lock compartment 302 is decreased to establish a low pressure (e.g., about 3 torr). It should be appreciated that a low pressure (e.g., subatmospheric) has been previously established within buffer chamber 304 and vacuum planarization chamber 306. Located with buffer chamber 304 is a mechanical arm (not shown) capable of rotating and extending in order to remove a semiconductor wafer from the cassette, which is located within load lock compartment 302. The mechanical arm transports the semiconductor wafer into vacuum planarization chamber 306.

While within vacuum planarization chamber 306 of FIG. 3, the semiconductor wafer is planarized utilizing a combination of dry abrasion and dry chemistry (e.g., plasma gas) in accordance with one embodiment of the present invention, which is described in greater detail below. Upon completion of the planarization of the semiconductor wafer, the mechanical arm within buffer chamber 304 transports the semiconductor wafer back into the cassette located with load lock compartment 302. Thus, each semiconductor wafer contained within the cassette is transported from load lock compartment 302 into vacuum planarization chamber 306 to be planarized and then returned to load lock compartment 302. The door of load lock compartment 302 remains closed during the entire planarization process of the semiconductor wafers contained within the cassette because buffer chamber 304 and vacuum planarization chamber 306 are under a vacuum at this point of the process.

Subsequently, when all of the semiconductor wafers have been planarized and returned to the cassette located within load lock compartment 302, the pressure within load lock compartment 302 is increased from about 3 torr to about 760 torr or 1 atmosphere. At that point the door of load lock compartment 302 is opened and the cassette of semiconductor wafers can be removed.

Figure 4:
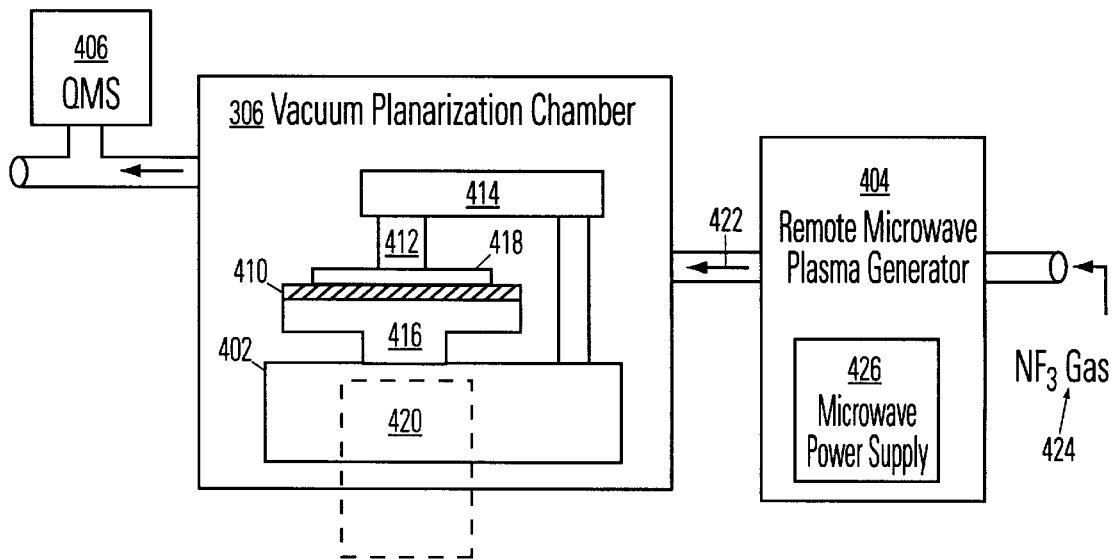
FIG. 4 is a block diagram of one embodiment of a system associated with the vacuum planarization chamber of FIG. 3 in accordance with the present invention.

FIG. 4 is a block diagram of one embodiment of a system 400 associated with vacuum planarization chamber 306 of FIG. 3 in accordance with the present invention. The main purpose of system 400 is to planarize semiconductor wafers. System 400 is adapted to accomplish this planarization by effectively removing all, or a portion of, a layer of dielectric material of a semiconductor wafer through the application of dry abrasion and dry chemistry. As such, system 400 flattens out height differences of the dielectric material, since high areas of topography are removed faster than low areas. It should be appreciated that system 400 has the capability of smoothing out topography over millimeter scale planarization distances, leading to maximum angles of much less than one degree after planarization.

Figure 5:
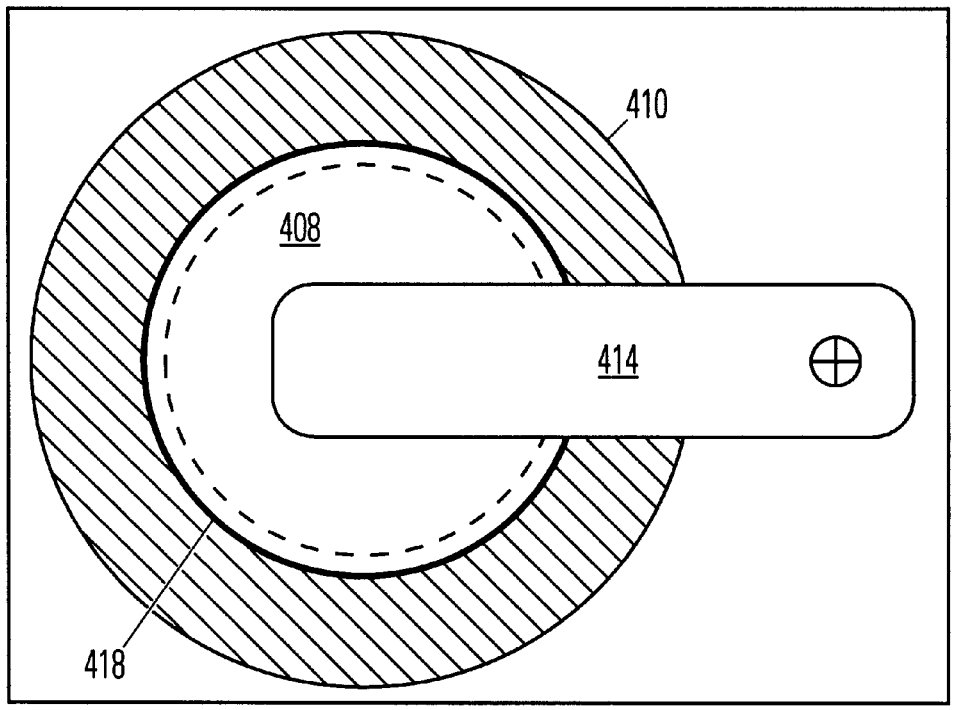
FIG. 5 is a top view of one embodiment of the abrading machine of FIG. 4 in accordance with the present invention.

Specifically, system 400 is comprised of several main components which enable dry planarization of semiconductor wafers. For instance, a remote microwave plasma generator 404 is coupled to vacuum planarization chamber 306 in order to provide dry chemistry for the dry planarization process. Additionally, a quadrupole mass spectrometry (QMS) device 406 is coupled to vacuum planarization chamber 306 in order to provide end point detection for the process. Moreover, an abrading machine 402 is located within vacuum planarization chamber 306 to provide dry abrasion to semiconductor wafers. It should be appreciated that FIG. 5 is a top view of one embodiment of abrading machine 402 of FIG. 4 in accordance with the present invention.

Referring still to FIG. 4, one embodiment of a dry planarization process in accordance with the present invention begins when the mechanical arm, located within buffer chamber 304 of FIG. 3, transports a semiconductor wafer 408 (hidden in FIG. 4) into vacuum planarization chamber 306 and places it onto an abrasive polishing pad 410 of abrading machine 402. Abrasive polishing pad 410 is made of a resilient textured material that includes abrasive particles embedded within it in order to aid the abrading process of semiconductor wafer 408. It should be appreciated that these abrasive particles can be made of a variety of materials (e.g., silicon dioxide, cerium oxide, zirconium oxide) in accordance with the present embodiment. It should be further appreciated that one embodiment of abrasive polishing pad 410 is perforated to enable introduction of the gases through it.

Abrading machine 402 picks up semiconductor wafer 408 with a wafer holder 412, which is connected to an arm 414. Abrasive polishing pad 410 begins rotating at a predetermined speed on a platen 416, or turn table located beneath abrasive polishing pad 410. Platen 416 is rotated by a rotating disc reactor 420. It should be appreciated that there are several different embodiments of rotating disc reactor 420 in accordance with the present invention. For instance, one embodiment of rotating disc reactor 420 is implemented by magnetically coupling platen 416 to a motor that is external to vacuum planarization chamber 306. Another embodiment of rotating disc reactor 420 is implemented by coupling platen 416 to a hermetically sealed motor that is internal to vacuum planarization chamber 306. One of the main purposes of utilizing rotating disc reactor 420 is to eliminate the release of extraneous particles within vacuum planarization chamber 306.

As described above, abrasive polishing pad 410 begins rotating at a predetermined speed on a platen 416. Arm 414 forces semiconductor wafer 408 into abrasive polishing pad 410 with a predetermined amount of down force. Semiconductor wafer 408 is held in place on abrasive polishing pad 410 within a carrier ring 418 that is connected to wafer holder 412 of arm 414. The lower surface of semiconductor wafer 408 rests against abrasive polishing pad 410 while the upper surface of semiconductor wafer 408 is against the lower surface of wafer holder 412 of arm 414. As abrasive polishing pad 410 rotates, arm 414 also rotates semiconductor wafer 408 at a predetermined rate. As a result of abrading the surface of semiconductor wafer 408, abrasive polishing pad 410 weakens or breaks a plurality of chemical bonds of a thin layer (e.g., mono-layer) of the dielectric surface material. As such, the thin layer of dielectric surface material becomes amenable for chemical attack.

Specifically, the contact mode between the abrasive particles of abrasive polishing pad 410 and the dielectric surface material of semiconductor wafer 408 is that of traveling Hertzian indentor mode, which is known by those skilled in the art. As an abrasive particle of abrasive polishing pad 410 moves across the dielectric surface of semiconductor wafer 408 it gives rise to subsurface stress fields, resulting in compressive stress in the leading edge and tensile stress at the trailing edge. The stress field depths are on the order of a few nanometers. The generation of stress fields in the dielectric material by itself results in rapid bond breaking. As a result, the present embodiment is effective for planarizing even stubborn material such as organic polymers. That is, because the combination of dry abrasion and dry chemistry of the present embodiment is able to remove material from the surface of an organic polymer without softening it.

Referring now to FIGS. 4 and 5, once abrading machine 402 of FIGS. 4 and 5 begins the process of abrading the dielectric surface material of semiconductor wafer 408, remote microwave plasma generator 404 begins generating a plasma gas 422 (e.g., a reactive gas) which is subsequently pumped into vacuum planarization chamber 306. The main purpose of plasma gas 422 within the present embodiment is to remove material from the abraded dielectric surface material of semiconductor water 408. Specifically, plasma gas 422 chemically reacts with the broken bonds of the dielectric surface material of semiconductor water 408, thereby creating a highly volatile gas species which is subsequently pumped out of vacuum planarization chamber 306. This process of removing material from the surface of the semiconductor wafer continues until the dielectric surface of semiconductor wafer 408 is sufficiently planarized.

With reference still to FIGS. 4 and 5, more specifically, remote microwave plasma generator 404 generates plasma gas 422, which is a combination of neutral species and ions, containing low energy reactive radicals. Essentially, plasma gas 422 is a reactive gas (e.g., an ionized gas). It should be appreciated that within the present embodiment plasma gas 422 is generated remotely in order to avoid additional generation of ion energy within vacuum planarization chamber 306. In order to generate plasma gas 422 in one embodiment, $NF_3$ gas 424 is input into remote microwave plasma generator 404. It should be further appreciated that remote microwave plasma generator 404 of the present embodiment is well equipped to utilize many different fluorine component gases (e.g., $CF_4$) in order to generate plasma gas 422. Upon receiving $NF_3$ gas 424, remote microwave plasma generator 404 utilizes microwaves generated by a microwave power supply 426 to break down $NF_3$ gas 424 into plasma gas 422 containing nitrogen fluorine (NF) and fluorine particle species. It should be appreciated that one embodiment of remote microwave plasma generator 404 can use radio frequency (rf) energy to break down $NF_3$ gas 424 into plasma gas 422. It should be further appreciated that the resulting fluorine particle species of plasma gas 422 are the desired output of remote microwave plasma generator 404. A constant amount of plasma gas 422 is continually generated and subsequently pumped into vacuum planarization chamber 306 for the duration of the abrading process of semiconductor wafers 408. The vacuum pressure that is suitable for the operation of remote microwave plasma generator 404 is on the order of about 0.1 to 10 torr.

When the low energy reactive radical fluorine particle species of plasma gas 422 come in contact with the broken chemical bonds of the abraded surface material of semiconductor wafer 408, they react and form a highly volatile gas species, e.g., silicon fluoride ($SiF_x$). Subsequently, the newly formed highly volatile gas species is pumped out of vacuum planarization chamber 306. Therefore, as the dielectric surface of semiconductor wafer 408 is constantly abraded by abrading machine 402, plasma gas 422 is constantly generated and pumped into vacuum planarization chamber 306 in order to remove surface material from the dielectric layer. Furthermore, the plasma gas 422 also removes extraneous dielectric surface material from the surface of abrasive polishing pad 410 during the planarization process, thereby keeping it free from extraneous material.

It should be appreciated that the abrading process of the dielectric layer of semiconductor wafer 408 is typically very effective on its higher topography, thereby enabling plasma gas 422 to react with the resulting broken chemical bonds of dielectric material in those areas. Accordingly, as more and more of the dielectric surface material is removed from the higher topography areas, more of semiconductor wafer 408 is planarized. Conversely, since the abrading process of the dielectric layer of semiconductor wafer 408 typically is not in physical contact with the lower topography, the chemical bonds of those areas typically remain unbroken. As such, plasma gas 422 is ordinarily unable to react with the surface dielectric material of the lower topography areas of semiconductor wafer 408. Therefore, the abrading and chemical removal process of the present embodiment preferentially removes dielectric surface material from the higher topography resulting in the eventual planarization of semiconductor wafer 408. It should be further appreciated that the abrading and chemical removal process of the present embodiment is capable of removing at least 50 Angstroms per second of dielectric surface material from semiconductor wafer 408 during the dry planarization process.

Quadrupole mass spectrometry (QMS) device 406 of FIG. 4 is coupled to vacuum planarization chamber 306 in order to determine when planarization of semiconductor wafer 408 has been reached. In other words, QMS device 406 provides end point detection for the dry planarization process of semiconductor wafer 408. In order to provide this functionality, QMS device 406 monitors or samples the change in concentration of a particular gas species (e.g., fluorine species, silicon fluoride species, etc.) exiting an outlet of vacuum planarization chamber 306 during the dry planarization process. Therefore, once the concentration of the particular gas species reaches a predetermined level, QMS device 406 causes abrading machine 402 to stop abrading the dielectric surface of semiconductor wafer 408.

Specifically, during the dry planarization process of semiconductor wafer 408 of the present embodiment, remote microwave plasma generator 404 pumps a constant amount of plasma gas 422, containing a constant concentration of fluorine species, into vacuum planarization chamber 306. Furthermore, a constant amount of gas species (e.g., plasma gas 422, fluorine species, and silicon fluoride species) are pumped out of vacuum planarization chamber 306 by a vacuum pump (not shown). Additionally, at the beginning of the abrading process of semiconductor wafer 408, typically only the highest topography of the dielectric surface material are abraded by abrasive polishing pad 410. As such, the initial amount of highly volatile gas species (e.g., silicon fluoride) created through the chemical reaction of the fluorine species with the first broken chemical bonds of the dielectric surface material is typically at the lowest level at which it will exist during the planarization process. Therefore, QMS device 406 initially detects a higher concentration level of unreacted fluorine species exiting vacuum planarization chamber 306 compared to the concentration level of highly volatile gas species (e.g., $SiF_x$). But as more and more dielectric surface material is removed during the planarization process of the present embodiment, the concentration level of fluorine species detected by QMS device 406 will continually decrease while the concentration level of highly volatile gas species will continually increase. Thus, QMS device 406 is equipped to determine that semiconductor wafer 408 is fully planarized when the concentration level of the highly volatile species is sufficiently high. Conversely, QMS device 406 is also equipped to determine that semiconductor wafer 408 is planarized when the concentration level of the fluorine species is sufficiently low. In this manner, QMS device 408 of the present embodiment provides strong end point detection for the dry planarization process of semiconductor wafer 408.

It should be appreciated that the present embodiment of dry planarization of semiconductor wafer 408 does not produce significant amounts of liquid waste by-products in comparison to typical wet CMP processes. Furthermore, the present embodiment can effectively planarize semiconductor wafer 408 having spin on glass materials (e.g., HSQ and MSQ) deposited thereon because it utilizes a dry process. Moreover, the present embodiment can effectively planarize semiconductor wafer 408 having organic polymers (e.g., carbon hydrogen) deposited thereon. Additionally, the present embodiment provides a dry process for planarizing semiconductors wafers which typically results in a more controllable and predictable process than typical wet CMP processes.

Figure 6:
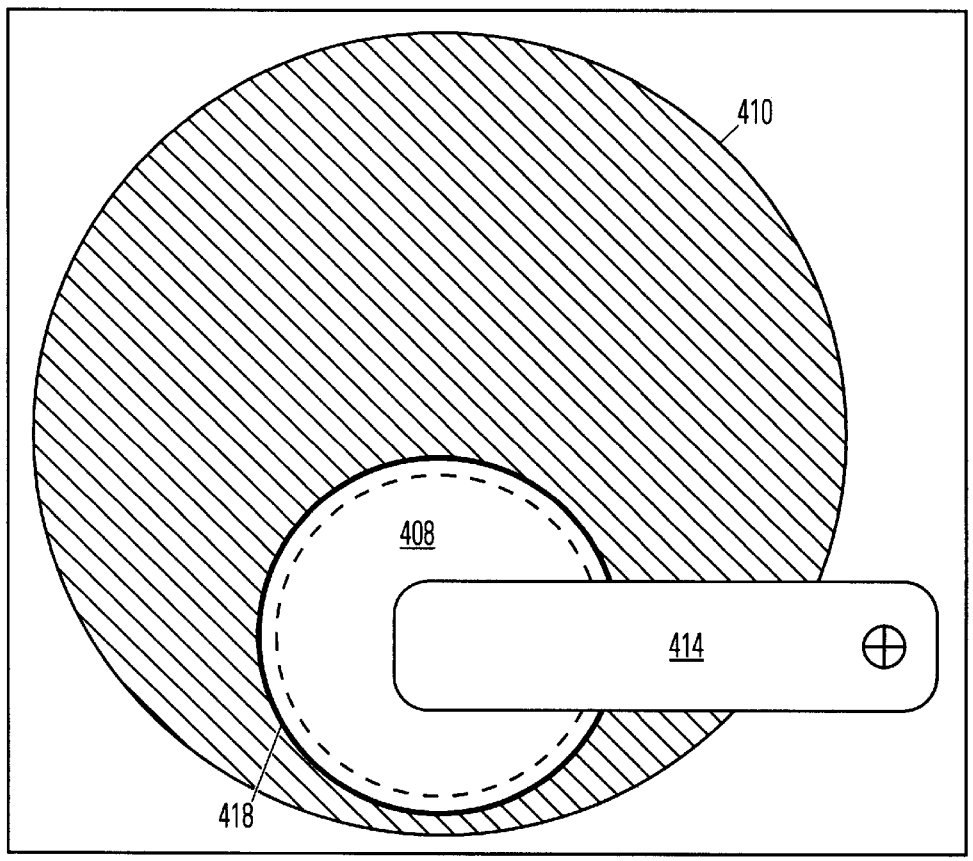
FIG. 6 is a top view of another embodiment of the abrading machine of FIG. 4 in accordance with the present invention.

FIG. 6 is a top view of another embodiment of abrading machine 402 of FIG. 4 in accordance with the present invention. Semiconductor wafer 408 is held on the surface of abrasive polishing pad 410 in an off-centered position by arm 414 of abrading machine 402. Within one embodiment the rotation speeds of both abrasive polishing pad 410 and semiconductor wafer 408 are chosen such that the relative velocity of every point on semiconductor wafer 408 with reference to abrasive polishing pad 410 is equal. Furthermore, arm 414 can translationally move semiconductor wafer 408 towards the center of abrasive polishing pad 410 and away from its center, such that semiconductor wafer 408 covers the radius of abrasive polishing pad 410. It should be appreciated that arm 414 of the present embodiment is capable of moving semiconductor wafer 408 across abrasive polishing pad 410 in a variety of ways.

Figure 7:
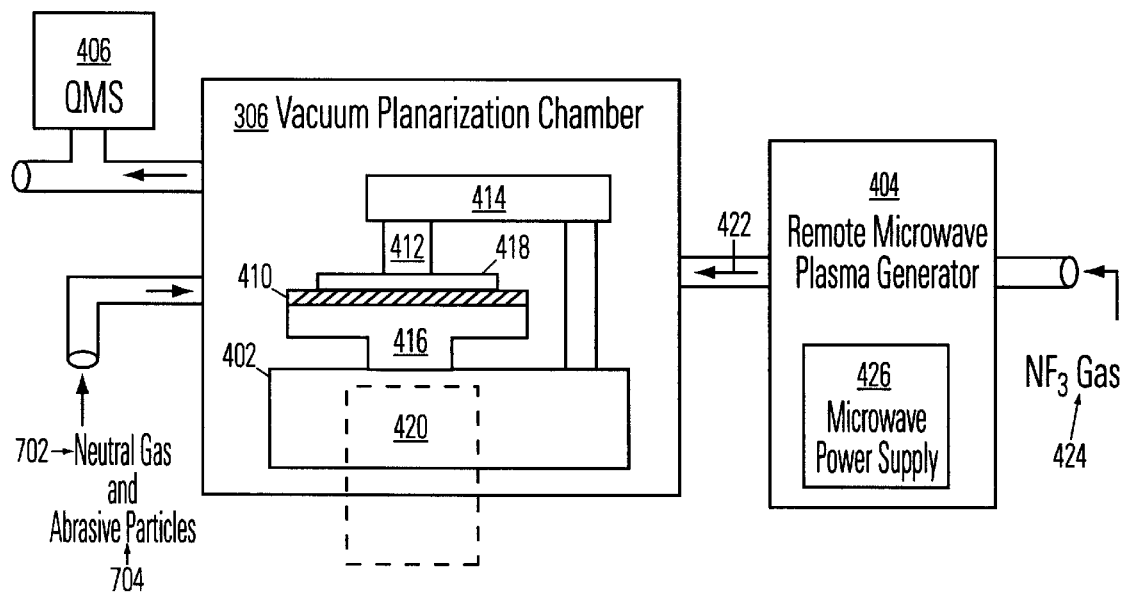
FIG. 7 is a block diagram of another embodiment of a system associated with the vacuum planarization chamber of FIG. 3 in accordance with the present invention.

FIG. 7 is a block diagram of one embodiment of a system 700 associated with vacuum planarization chamber 306 of FIG. 3 in accordance with the present invention. System 700 is very similar to system 400 of FIG. 4, as described above. The major difference between the two systems is that within system 700 there are no abrasive particles embedded within a polishing pad 706 of abrading machine 402. Instead, a neutral or inert gas 702 serves as a continuous transport medium for abrasive particles 704 (e.g., silicon dioxide, cerium oxide, zirconium oxide, etc.) into vacuum planarization chamber 306. Abrasive particles 704 are small enough to fit between semiconductor wafer 408 and polishing pad 706, thereby enabling the abrading of a dielectric surface of semiconductor wafer 408, as described above. It should be appreciated that neutral gas 702 (e.g., nitrogen or argon gas) can also serve as a cooling medium to avoid damage during the abrading of the surface of semiconductor wafer 408. It should be further appreciated that the remainder of system 700 operates in substantially the same fashion as system 400 of FIG. 4.

Figure 8:
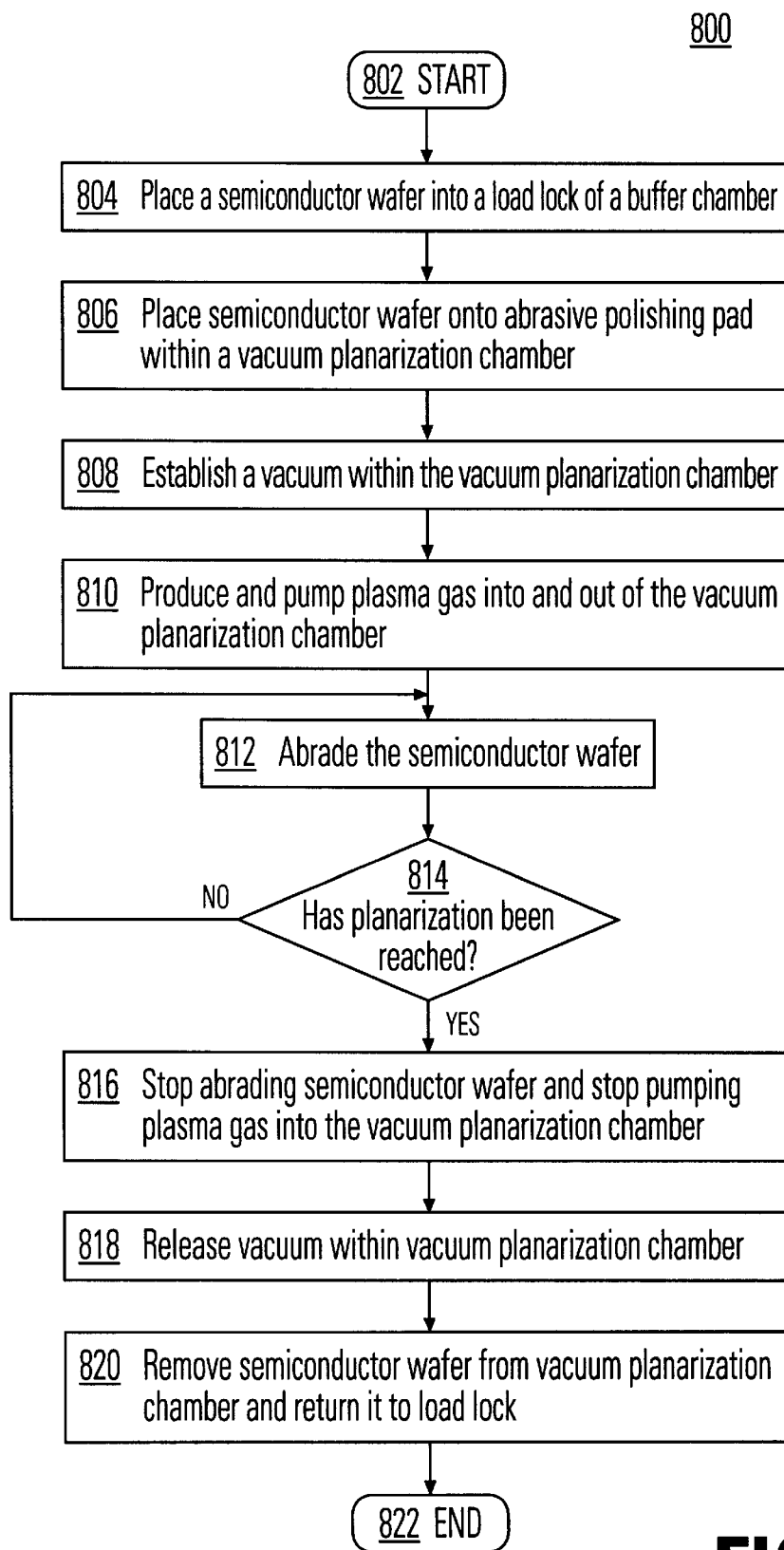
FIG. 8 is a flowchart of a method in accordance with one embodiment of the present invention for dry planarization of semiconductor wafers.

FIG. 8 is a flowchart of a method 800 in accordance with one embodiment of the present invention for dry planarization of semiconductor wafers. Process 800 starts at step 802 and at step 804, a semiconductor wafer is placed within a load lock of a buffer chamber in accordance with the present embodiment. It should be appreciated that the semiconductor wafer of the present embodiment could be located within a cassette when placed within the load lock.

During step 806, a mechanical arm capable of rotating and extending, picks up the semiconductor wafer within the load lock and places it onto an abrasive polishing pad of an abrading machine in accordance with the present embodiment. The abrading machine is located within a vacuum planarization chamber. It should be appreciated that there are many different ways in accordance with the present embodiment that the semiconductor wafer can be moved from the load lock onto the abrasive polishing pad during step 806.

Within step 808 of FIG. 8, a low pressure is established within the vacuum planarization chamber equal to about 3 torr. It should be appreciated that the low pressure within the vacuum planarization chamber in accordance with the present embodiment is not strictly limited to the value of 3 torr. For example, the low pressure within the vacuum planarization chamber could be equal to a pressure range of about 0.1 to 10 torr within the present embodiment. Furthermore, the low pressure within the vacuum planarization chamber could be equal to a subatmospheric pressure within the present embodiment.

During step 810, plasma gas is generated by a remote microwave plasma generator and then pumped into and out of the vacuum planarization chamber. It should be appreciated that there are numerous ways in accordance with the present embodiment for generating plasma gas. It should be further appreciated that in the present embodiment, plasma gas is continuously generated and pumped into and out of the vacuum planarization chamber during steps 812 and 814 of process 800.

Within step 812 of FIG. 8, an arm of the abrading machine grabs the semiconductor wafer and then the abrasive polishing pad begins rotating beneath it at a predefined speed. During step 812, a wafer holder of the arm holds the semiconductor wafer against the surface of the rotating abrasive polishing pad by applying a specific amount of down force to the semiconductor wafer. In addition to the abrasive polishing pad rotating during step 812, the semiconductor wafer is also rotated at a predetermined speed by the wafer holder. As the semiconductor wafer is abraded by the abrasive polishing pad during step 812, some of the chemical bonds of its dielectric material are broken, thereby becoming amenable for chemical attack by the plasma gas. During step 812, the plasma gas forms a gaseous species, e.g., silicon fluoride ($SiF_x$), which is pumped out of the vacuum planarization chamber. In this manner, the present embodiment removes material from the surface of the dielectric layer of the semiconductor wafer at a nominal removal rate.

During step 814, a quadrupole mass spectrometry (QMS) is utilized to determine whether planarization of the surface of the semiconductor wafer has been achieved. If planarization has not been achieved, process 800 proceeds to step 812. If planarization has been achieved, process 800 proceeds to step 816.

Within step 816 of FIG. 8, the platen and wafer holder of the abrading machine both stop rotating in order to discontinue abrading the planarized semiconductor wafer. Furthermore, during step 816, the wafer holder leaves the planarized semiconductor wafer on the surface of the abrasive polishing pad and plasma gas is no longer pumped into the vacuum planarization chamber.

During step 818, the vacuum established within the vacuum planarization chamber is released in preparation for removing the semiconductor.

Within step 820 of FIG. 8, the mechanical arm picks up the semiconductor wafer from the abrasive polishing pad and removes it from the vacuum planarization chamber. Furthermore, during step 820, the mechanical arm places the semiconductor wafer within the load lock of the buffer chamber.

Process 800 of FIG. 8 is then exited during step 822 indicating that the dry planarization process of the semiconductor wafer has been completed in accordance with the present embodiment.

Figure 9:
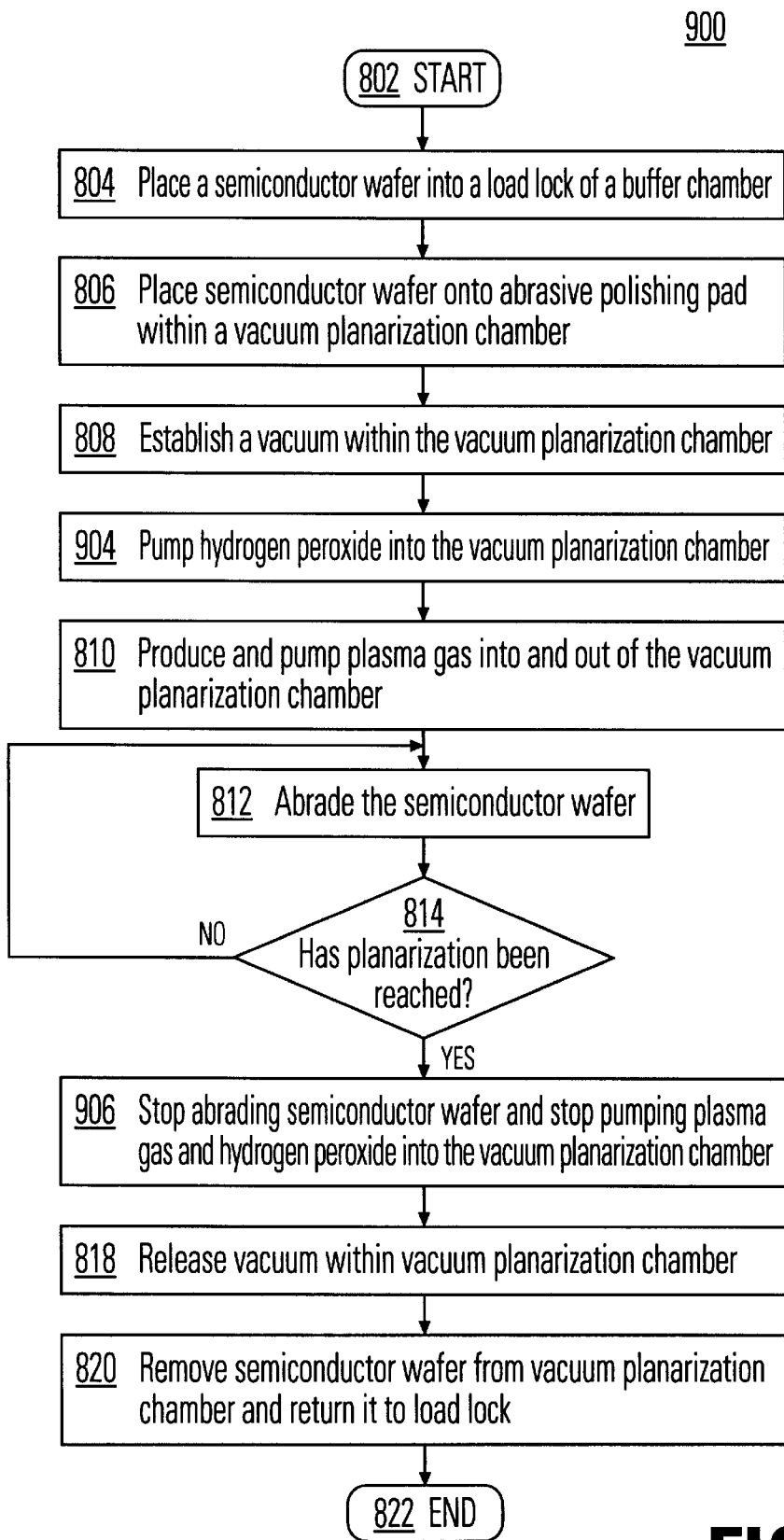
FIG. 9 is a flowchart of a method in accordance with one embodiment of the present invention for softening a dielectric layer as part of a dry planarization of semiconductor wafers.

FIG. 9 is a flowchart of a method 900 in accordance with one embodiment of the present invention for softening a dielectric layer as part of dry planarization of semiconductor wafers. As such, the chemical bonds of the dielectric layer are easier to break during the abrading of the surface of the dielectric layer. It should be appreciated that steps 802–814 and 818–820 of process 900 are substantially the same as steps 802–814 and 818–820 of process 800 of FIG. 8. One of the main differences between processes 900 and 800 is that process 900 utilizes hydrogen peroxide during its dry planarization of the semiconductor wafer.

Specifically, during step 904, hydrogen peroxide is pumped into the vacuum planarization chamber. As the hydrogen peroxide comes in contact with the dielectric layer of the semiconductor wafer to be planarized, the dielectric layer, e.g., silicon dioxide ($SiO_2$), is hydrolyzed into a significantly softer material (e.g., SiOH). As such, the chemical bonds of the softer dielectric layer are easier to break during the abrading process of step 812, described above. It should be appreciated that in the present embodiment, hydrogen peroxide is continuously pumped into the vacuum planarization chamber during steps 812 and 814 of process 900. It should be further appreciated that some amount of hydrogen peroxide will inadvertently be pumped out of the vacuum planarization chamber while the plasma gas is pumped out during step 812, as described above.

Within step 906, the platen and wafer holder of the abrading machine both stop rotating in order to discontinue abrading the planarized semiconductor wafer. Furthermore, during step 906, the wafer holder leaves the planarized semiconductor wafer on the surface of the abrasive polishing pad. Moreover, during step 906, both the plasma gas and the hydrogen peroxide are no longer pumped into the vacuum planarization chamber.

Process 900 of FIG. 9 is then exited during step 908 indicating that the dry planarization process of the semiconductor wafer has been completed in accordance with the present embodiment.

Figure 10:
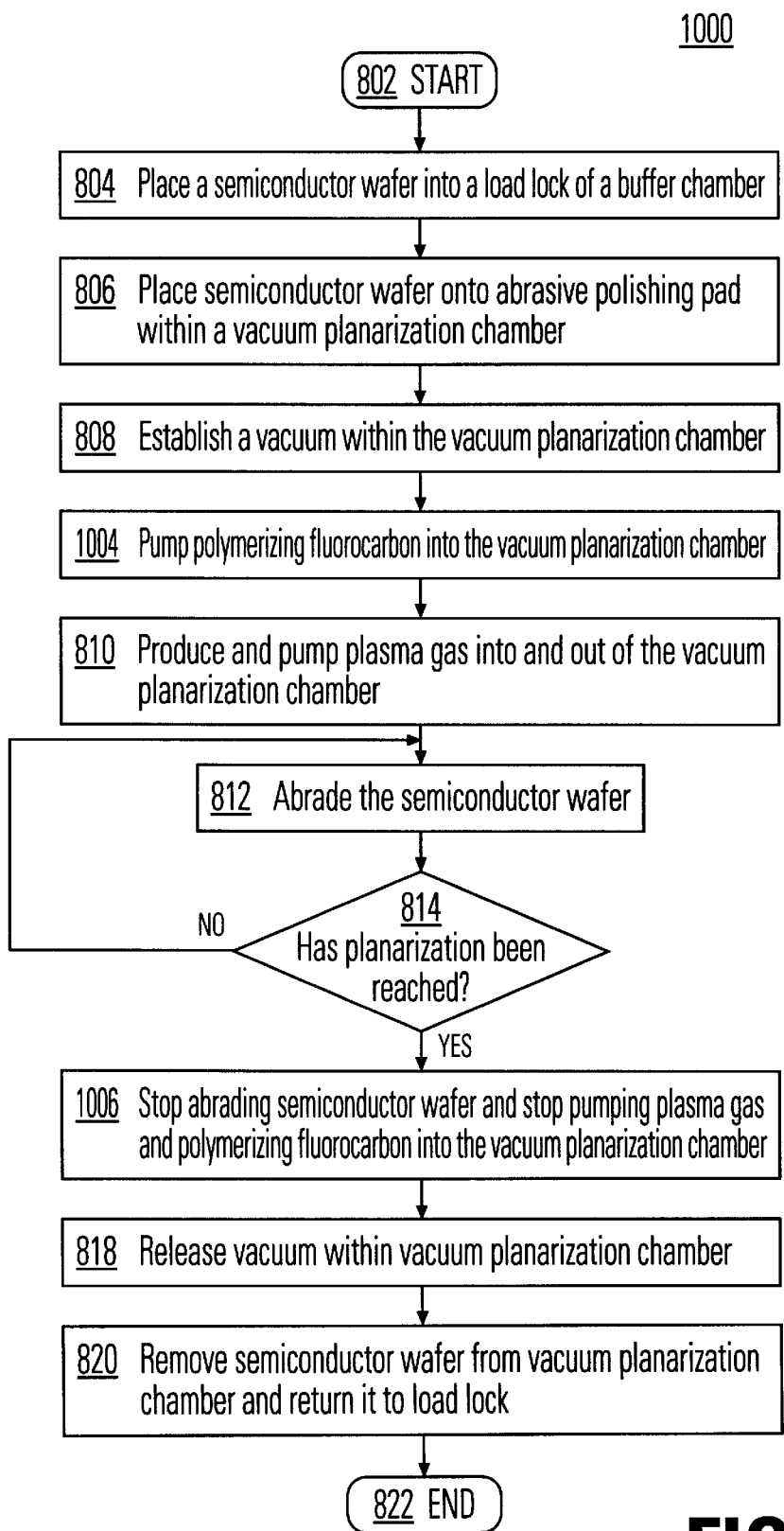
FIG. 10 is a flowchart of a method in accordance with one embodiment of the present invention for avoiding dishing during dry planarization of semiconductor wafers.

FIG. 10 is a flowchart of a method 1000 in accordance with one embodiment of the present invention for avoiding dishing during dry planarization of semiconductor wafers. More specifically, during process 1000, a protective layer of polymer is formed in order to protect the lower topography of the dielectric layer from dishing. It should be appreciated that steps 802–814 and 818–820 of process 1000 are substantially the same as steps 802–814 and 818–820 of process 800 of FIG. 8. One of the main differences between processes 1000 and 800 is that process 1000 utilizes polymerizing fluorocarbon during its dry planarization of the semiconductor wafer.

Specifically, during step 1004, some type of polymerizing fluorocarbon (e.g., $CHF_3+CF_4$) is pumped into the vacuum planarization chamber. As the polymerizing fluorocarbon comes in contact with the dielectric layer of the semiconductor wafer, it forms a polymer layer on top of the dielectric layer. This polymer layer acts as a protective layer for the lower topography of the dielectric layer during the abrading process of step 812, described above. For instance, during the abrading process of step 812, the high areas of topography (hills) of the dielectric layer are removed faster than the low areas of topography (valleys). As such, the abrasive polishing pad removes the polymer from the higher topography, thereby exposing the dielectric material (e.g., silicon dioxide) beneath it. As the fresh surface of dielectric material is exposed and abraded, it is removed through its reaction with the plasma gas of step 810, as described above. Conversely, the dielectric material of the lower topographies are not removed by the plasma gas because they remain covered by polymer. It should be appreciated that in the present embodiment polymerizing fluorocarbon is continuously pumped into the vacuum planarization chamber during steps 812 and 814 of process 1000. It should be further appreciated that some amount of polymerizing fluorocarbon will inadvertently be pumped out of the vacuum planarization chamber while the plasma gas is pumped out during step 812, as described above.

Within step 1006, the platen and wafer holder of the abrading machine both stop rotating in order to discontinue abrading the planarized semiconductor wafer. Furthermore, during step 1006, the wafer holder leaves the planarized semiconductor wafer on the surface of the abrasive polishing pad. Moreover, during step 1006, both the plasma gas and the polymerizing fluorocarbon are no longer pumped into the vacuum planarization chamber.

Process 1000 of FIG. 10 is then exited during step 1008 indicating that the dry planarization process of the semiconductor wafer has been completed in accordance with the present embodiment.

Thus, a system and method of dry planarization for semiconductor wafers in accordance with the present invention provides several advantages. For instance, unlike conventional wet CMP processes, the present invention does not produce significant amounts of liquid waste by-products. Furthermore, the present invention effectively planarizes semiconductor wafers having spin on glass materials (e.g., HSQ and MSQ) or organic polymers (e.g., carbon hydrogen) disposed thereon. Additionally, the present invention enables quick planarization of semiconductor wafers while also providing strong end point detection. Moreover, the present invention provides a dry process for planarizing semiconductors wafers wherein the process is more controllable and predictable than are typical wet CMP processes. More predictable planarization reduces the use of test wafers to determine the current performance of the abrading machine, resulting in additional cost savings for the manufacturer of semiconductor devices.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the Claims appended hereto and their equivalents.

What is claimed is:

1. A method for improving planarization of a semiconductor wafer, said method comprising the steps of:

(a) placing a semiconductor wafer onto a polishing pad of a mechanical abrading machine, wherein said semiconductor wafer includes a dielectric layer, wherein said semiconductor wafer and said polishing pad are located within a vacuum chamber;

(b) forming a vacuum within said vacuum chamber;

(c) breaking or weakening a plurality of chemical bonds of said dielectric layer of said semiconductor wafer through an action of frictionally moving said dielectric layer against a dry surface of said polishing pad, wherein said step of breaking or weakening said plurality of chemical bonds results in material of said dielectric layer becoming amenable for chemical attack; and (d) removing said material of said dielectric layer from said vacuum chamber utilizing a reactive gas.

2. The method as described in claim 1 further comprising the step of:

(e) exposing said dielectric layer to a hydrogen peroxide.

3. The method as described in claim 1 further comprising the step of:

(e) exposing said dielectric layer to a polymerizing fluorocarbon in order to coat a surface of said dielectric layer with a polymer.

4. The method as described in claim 3 wherein said step (e) comprises exposing said dielectric layer to $CHF_3+CF_4$.

5. The method as described in claim 1 further comprising the step of:

(e) generating said reactive gas utilizing a fluorine component gas.

6. The method as described in claim 5 wherein said step (e) comprises generating said reactive gas utilizing $NF_3$.

7. The method as described in claim 5 wherein said step (e) comprises generating said reactive gas utilizing $CF_4$.

8. The method as described in claim 1 further comprising the step of:

(e) generating said reactive gas utilizing microwaves or rf energy.

9. The method as described in claim 1 wherein said step (d) comprises removing said material of said dielectric layer from said vacuum chamber utilizing a reactive gas containing fluorine particle species.

10. The method as described in claim 1 wherein said step (b) comprises forming a pressure within said vacuum chamber of about 0.1 to 10 torr.

11. The method as described in claim 1 wherein said step (c) comprises breaking a plurality of chemical bonds of said dielectric layer of said semiconductor wafer through an action of frictionally moving said dielectric layer against a dry surface of said polishing pad embedded with abrasive particles.

12. The method as described in claim 11 wherein said step (c) further comprises breaking said plurality of chemical bonds of said dielectric layer of said semiconductor wafer through said action of frictionally moving said dielectric layer against said dry surface of said polishing pad embedded with silicon dioxide abrasive particles.

13. The method as described in claim 11 wherein said step (c) further comprises breaking said plurality of chemical bonds of said dielectric layer of said semiconductor wafer through said action of frictionally moving said dielectric layer against said dry surface of said polishing pad embedded with cerium oxide abrasive particles.

14. The method as described in claim 11 wherein said step (c) further comprises breaking said plurality of chemical bonds of said dielectric layer of said semiconductor wafer through said action of frictionally moving said dielectric layer against said dry surface of said polishing pad embedded with zirconium oxide abrasive particles.

15. A method for planarizing a layer of material, said method comprising the steps of:

(a) mechanically polishing a layer of material to provide a mechanically polished surface of said layer of material having improved planarity; and (b) subjecting said mechanically polished surface of said layer of material to an ionized gas to further facilitate planarization of said layer of material.

* * * * *